United States Patent
Balasubramanyam et al.

[11] Patent Number: 6,090,671
[45] Date of Patent: Jul. 18, 2000

[54] REDUCTION OF GATE-INDUCED DRAIN LEAKAGE IN SEMICONDUCTOR DEVICES

[75] Inventors: Karanam Balasubramanyam, Hopewell Junction, N.Y.; Martin Gall, South Burlington, Vt.; Jeffrey P. Gambino, Gaylorsville, Conn.; Jack A. Mandelman, Stormville, N.Y.

[73] Assignees: Siemens Aktiengesellschaft, Munich, Germany; International Business Machines Corporation, Armonk, N.Y.

[21] Appl. No.: 08/941,600

[22] Filed: Sep. 30, 1997

[51] Int. Cl.[7] .................................................. H01L 21/336
[52] U.S. Cl. ......................... 438/291; 438/530; 438/910
[58] Field of Search .................................... 438/265, 289, 438/290, 291, 530, 910, 920, 308

[56] References Cited

U.S. PATENT DOCUMENTS

| | | | |
|---|---|---|---|
| 3,876,472 | 4/1975 | Polinsky | 438/530 |
| 3,925,107 | 12/1975 | Gdula et al. | 438/910 |
| 3,959,025 | 5/1976 | Polinsky | 438/301 |
| 4,151,008 | 4/1979 | Kirkpatrick | 438/530 |
| 4,621,413 | 11/1986 | Lowe et al. | 438/308 |
| 5,382,533 | 1/1995 | Ahmad et al. | 438/910 |

OTHER PUBLICATIONS

Wolf et al., Silicon Processing for the VLSI Era, vol. 1—Process Technology, pp. 56–58, 1986.

*Primary Examiner*—Chandra Chaudhari
*Attorney, Agent, or Firm*—Stanton C. Braden

[57] ABSTRACT

Reduction of gate-induced-drain-leakage in metal oxide semiconductor (MOS) devices is achieved by performing an anneal in a non-oxidizing ambient. In one embodiment, the anneal is performed in a argon and/or ammonia ambients after gate sidewall oxidation that forms the spacers.

8 Claims, 3 Drawing Sheets

REDUCTION OF GATE-INDUCED DRAIN LEAKAGE IN SEMICONDUCTOR DEVICES

FIELD OF INVENTION

The invention generally relates to semiconductor devices and, more particularly, to reducing oxidation gate-induced drain leakage.

BACKGROUND OF INVENTION

In device fabrication, insulating, semiconducting, and conducting layers are formed on a substrate. The layers are patterned to create features and spaces. The minimum dimension or feature size (F) of the features and spaces depend on the resolution capability of the lithographic systems. The features and spaces are patterned so as to form devices, such as transistors, capacitors, and resistors. These devices are then interconnected to achieve a desired electrical function, creating an integrated circuit (IC). The formation and patterning of the various device layers are achieved using conventional fabrication techniques, such as oxidation, implantation, deposition, epitaxial growth of silicon, lithography, and etching. Such techniques are described in S. M. Sze, *VLSI Technology*, 2nd ed., New York, McGraw-Hill, 1988, which is herein incorporated by reference for all purposes.

In metal oxide semiconductor (MOS) devices, leakage currents need to be reduced in order to reduce power consumption. An important leakage component in MOS devices is gate-induced drain leakage (GIDL), which is caused by trap assisted band-to-band tunneling at the surface of the drain of a MOS field effect transistor (MOSFET) where the gate overlaps the drain. During fabrication, interface states in the substrate are created. These surface states increases the rate of generation of electron-hole pairs, enhancing GIDL. The effects of surface states on GIDL are described in, for example, Chen et al., IEEE Elec. Dev. Lett., 10, 216 (1989), which is herein incorporated by reference for all purposes.

One conventional technique of reducing GIDL is to increase the oxidation temperature during gate oxide formation to about 1000–1100° C. Such technique is described in Joshi et al., IEEE Elec. Dev. Lett., 12, 28 (1991), which is herein incorporated by reference for all purposes. Increasing the oxidation temperature decreases surface state density in the substrate, reducing GIDL.

Increasing the oxidation temperature requires the use of a rapid thermal oxidation process (RTO). However, the use of RTO results in a gate oxide with poorer uniformity than with furnace oxidation. Non-uniformity of the gate oxide results in large variation of threshold voltages for the devices, which is undesirable.

Another technique for reducing GIDL is to implement lightly doped drain (LLD) devices. LLD devices to reduce GIDL is described in Parke et al., IEEE Trans. Elec. Dev., 39, 1694 (1992), which is herein incorporated by reference for all purposes. However, further reduction of GIDL is required for future generations of ICs, such as 256 Megabit dynamic random access memories (DRAMs).

From the above discussion, it is desirable to provide a device with lower GIDL.

SUMMARY OF INVENTION

The invention relates to the fabrication of integrated circuits. In particular, the invention reduces GIDL in MOS devices. The reduction in GIDL is achieved, in one embodiment, by annealing the device in a non-oxidizing ambient such as $NH_3$ and Ar. The anneal is preferably performed after gate sidewall oxidation, which forms sidewall spacers to control diffusion under the gate. The non-oxidizing ambient anneal reduces the surface states, thus resulting in reduced GIDL.

DETAILED DESCRIPTION OF THE INVENTION

The present invention relates to semiconductor MOS devices with reduced GIDL. For purposes of illustration, the present invention is described in the context of n-channel MOS devices. However, the invention is significantly broader. The invention is also applicable to p-channel devices. Such devices are used in the fabrication of an integrated circuit (IC). The IC includes, for example, a random access memory (RAM), a dynamic random access memory (DRAM), a synchronous DRAM (SDRAM), and a read only memory (ROM). Other IC such as an application specific IC (ASIC), a merged DRAM-logic circuit (embedded DRAM), or any other logic circuit is also useful.

Typically, numerous ICs are formed on the wafer in parallel. After processing is finished, the wafer is diced to separate the ICs to individual chips. The chips are then packaged, resulting in a final product that is used in, for example, consumer products such as computer systems, cellular phones, personal digital assistants (PDAs), and other electronic products.

Figure 1:
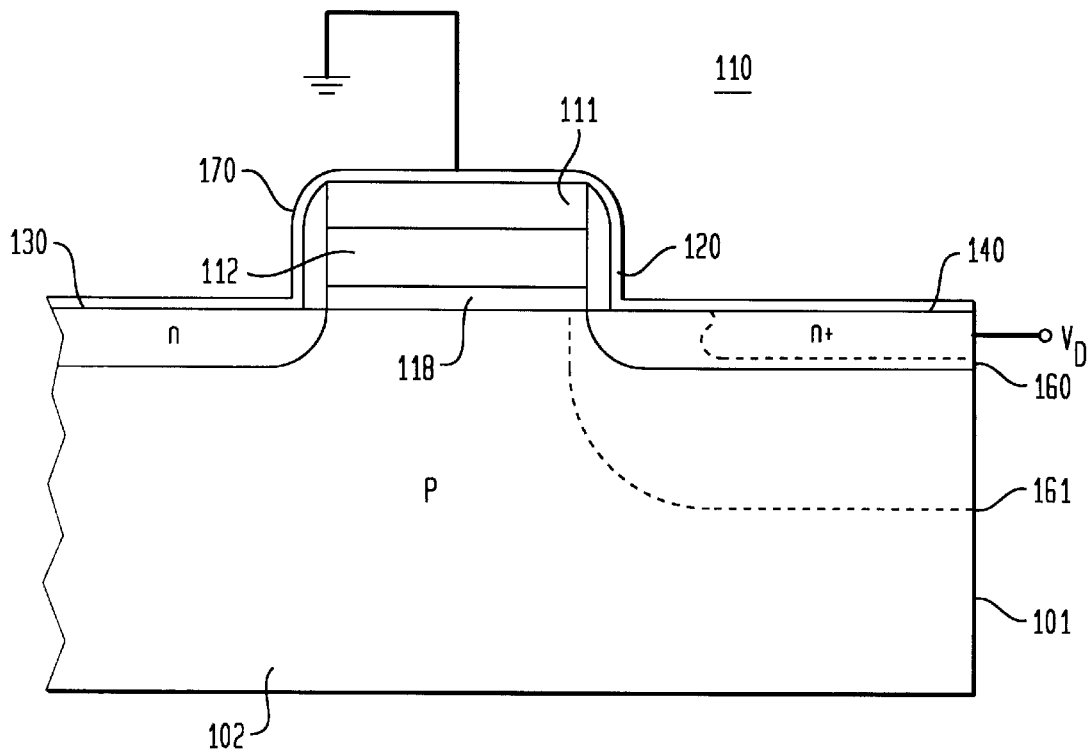
FIG. 1 shows a conventional MOS device.

For convenience, a description of an n-channel device is provided. Referring to FIG. 1, a conventional n-channel device is shown. As shown, the device 110 is formed on a substrate 101. The substrate includes a region doped with p-type dopants, such as boron (B), under the device. The device includes a gate region 111, source region 130, and drain region 140. The source and drain regions are heavily doped with n-type dopants such as phosphorous (P) or arsenic (As). Depending on the operation of the device, the source and drain regions are switched. For purposes of discussion, the terms drain and source are interchangeable.

The gate region typically comprises a polycrystalline (poly) layer 112 formed over a gate oxide 118. Alternatively, layer 112 comprises a polycide layer, which includes a layer of silicide over poly, forming a composite gate stack to reduce sheet resistance of the gate. A nitride cap 119 may be deposited over the gate by low pressure chemical vapor deposition (LPCVD). The cap serves as an etch stop for subsequent process steps. A spacer 120 is formed over the gate to define the underlap diffusion of the source and drain regions into the gate region, which reduces overlap capacitance. After spacer formation, a nitride layer 170 is deposited on the side of the gate and over the source, drain, and STI regions to provide a mobile ion barrier and also to serve as an etch stop.

A dielectric layer (not shown) is formed over the device structure to provide insulation between the conducting layers (except where contact is desired) or to act as a protective layer to insulate the device structure from impurities, moisture, and scratches. The dielectric layer, for example, includes phosphorus-doped silicon dioxide such as phosphosilicate glass (PSG) or borophosphosilicate glass (BPSG).

As shown, the gate is schematically connected to ground and the source is connected to $V_D$ (about 1.8–4.0V), creating a negative bias between the gate and drain. Such negative bias forms a deep depletion region, as indicated by dotted lines 160 and 161, in the gate/drain overlap region. The depletion region is significantly depleted of carriers (electron-hole pairs). The electric field is highest within the depletion region, leading to an increase rate of carrier generation. These generated carriers are rapidly swept out of the depletion region by the electric field. The electrons are collected by the drain and the holes by the p-well.

Of course, the device structure, as described in FIG. 1, has been simplified for purposes of illustration. For example, the actual device may include other regions, such as contacts, local interconnects, and capacitors. The formation of the various regions of the device structure is well-known and described in, for example, Wolf, *Silicon Processing for the VLSI Era*, Vol. 2, Lattice Press., which is herein incorporated by reference for all purposes.

Figure 2A:
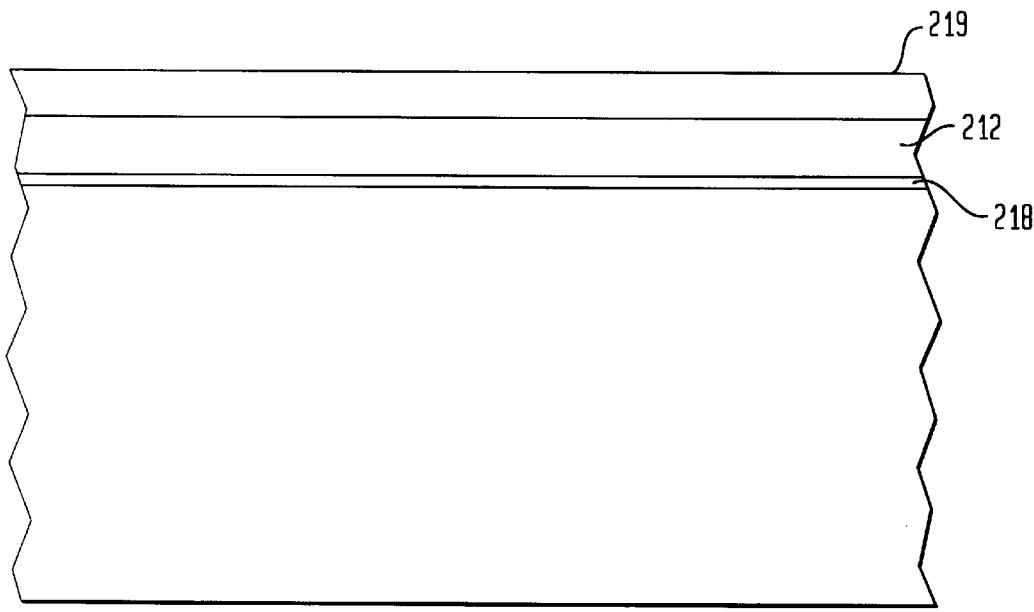
FIGS. 2a–c show the process for fabricating a MOS device in accordance with one embodiment of the invention.
Figure 2B:
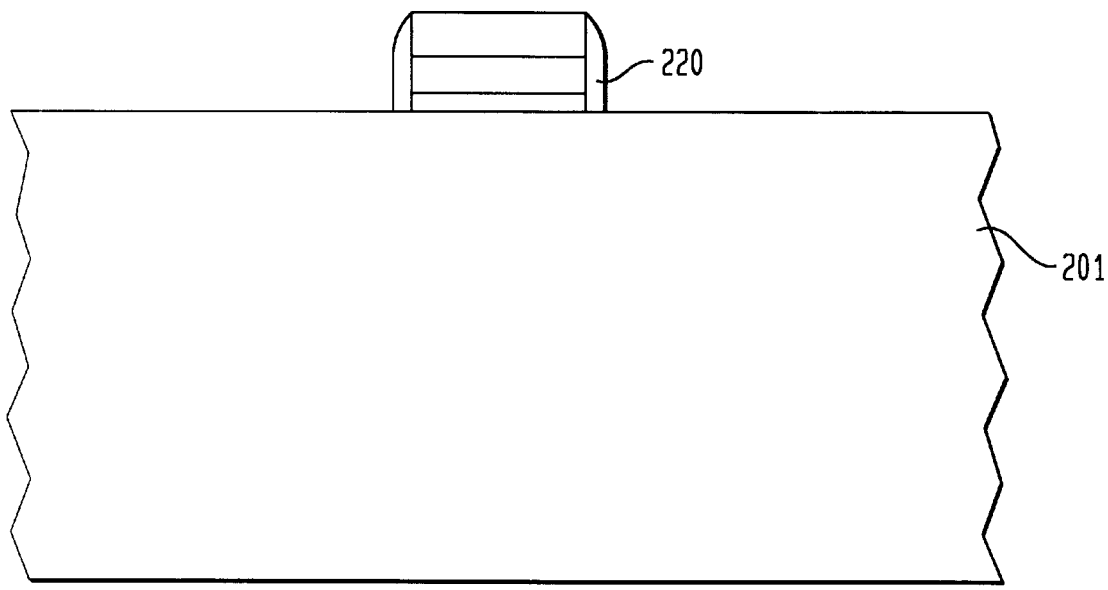
Figure 2C:
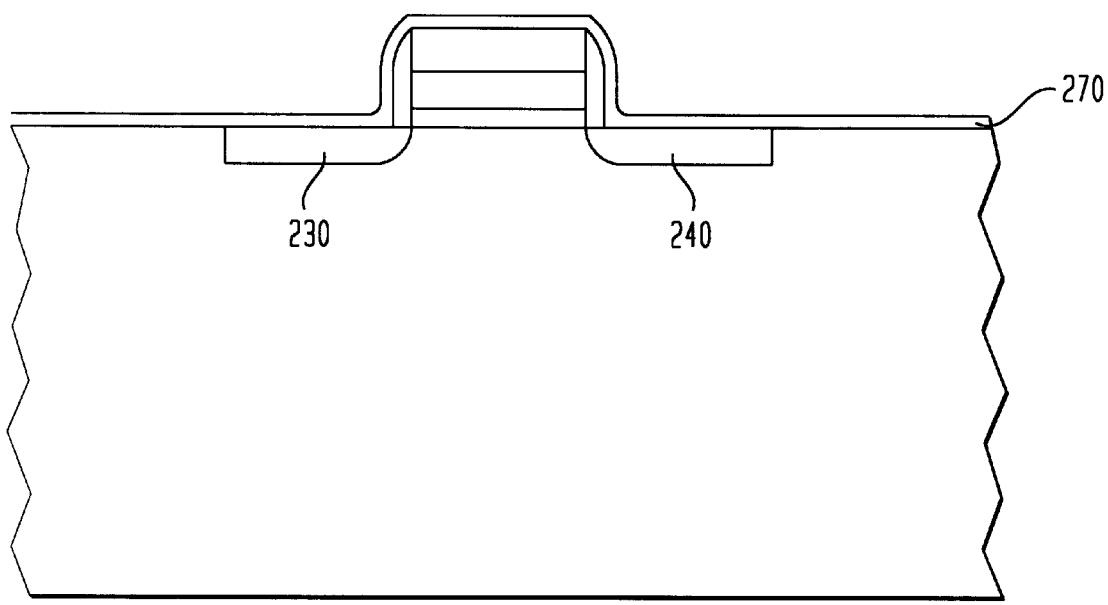

In accordance with the invention, a device with reduced GIDL is provided. Referring to FIGS. 2a–c, a process for fabricating the device with reduced GIDL in accordance with one embodiment of the invention is shown. In particular, the process forms an n-channel MOS device. As shown, a substrate 201, such as a silicon wafer, is provided. The major surface of the substrate is not critical and any suitable orientation such as a (100), (110), or (111) is useful.

A gate threshold voltage implant can be performed into the channel region to achieve a desired gate threshold voltage ($V_T$). The various layers forming the gate stack are then deposited over the surface of the substrate. This includes forming an oxide layer 218, for example, by thermal oxidation. The oxide layer serves as the gate oxide. A gate layer 212 comprising poly is then deposited over the gate oxide. Alternatively, the gate layer is a composite layer such as polycide comprising a silicide layer over a poly layer. The silicide layer may be formed from various silicides, including molybdenum ($MoSi_x$), tantalum ($TaSi_x$), tungsten ($WSi_x$), titanium silicide ($TiSi_x$), or cobalt silicide ($CoSi_x$). Formation of the poly or polycide layer is achieved using conventional techniques such as chemical vapor deposition (CVD). Other deposition techniques are also useful. A cap layer 219 is formed over the gate layer. The cap layer comprises, for example, nitride or other barrier materials.

Referring to FIG. 2b, the gate stack layers are patterned using conventional lithographic and etching techniques. Such techniques include depositing a layer of resist and selectively exposing it with an exposure source and mask. The exposed or unexposed regions, depending on whether a positive or negative resist is used, are removed during development. The regions of the gate stack layers unprotected by the resist are then etched by, for example, reactive ion etch (RIE), creating a gate stack 211. The sidewalls of the gate stack are oxidized, forming spacers 220. The thickness of spacers control the amount of diffusion gate edge to reduce overlap capacitance.

In accordance with the invention, the substrate is annealed after gate sidewall oxidation. The anneal is in a rapid thermal anneal (RTA) process. The temperature of the RTA is in the range of about 800–1200° C., preferably about 900–1100° C., more preferably about 1000–1100° C. The duration of the anneal is in the range of about for about 5 seconds to 2 hours, preferably about 5–90 seconds. Non-oxidizing ambients are used to anneal the substrate. In one embodiment, ammonia ($NH_3$) or argon (Ar) is used as the anneal ambient. The flow rate of $NH_3$ gas for an $NH_3$ anneal is about 3–10 liters/min and preferably about 5 liters/min; the flow rate of Ar gas for an Ar anneal is about 5–15 liters/min and preferably 10 liters/min. A mixture of $NH_3$ and Ar ambient is also useful to reduce GIDL. The flow rates of $NH_3$ and Ar are 3–5 and 2–5 liters/min, respectively. Preferably, the flow rates of $NH_3$ and Ar are 3 and 2 liters/min, respectively. It is believed that the anneal passivates the surface states, resulting in reduced GIDL.

Alternatively, the anneal can be performed after the formation of the gate stack and before gate sidewall oxidation. It is expected that annealing after gate sidewall oxidation is more effective for reducing GIDL than annealing after gate formation but before gate sidewall oxidation. Annealing after gate formation increases the thickness of the gate oxide at the edge of the gate. This increase in gate oxide thickness decreases band-to-band tunneling, thereby decreasing GIDL. However, the increase in gate oxide thickness can lead to increased stress in the gate oxide due to volume expansion associated with the conversion of silicon to silicon oxide ($SiO_2$). This stress is avoided by annealing after gate sidewall oxidation.

An experiment was conducted to measure the affects of the anneal in accordance with the invention on GIDL. Both n- and p-channel FETs were tested. The experiment included testing devices that: 1) have not been annealed after gate sidewall oxidation; 2) have been annealed in Ar after gate sidewall oxidation with a gas flow rate of about 10 liters/min, temperature of about 1050° C. and a duration of about 60 seconds; 3) have been annealed in $NH_3$ anneal after gate sidewall oxidation with a gas flow rate of 5 liters/min, temperature of about 1050° C., and a duration of about 60 seconds.

Figure 3:
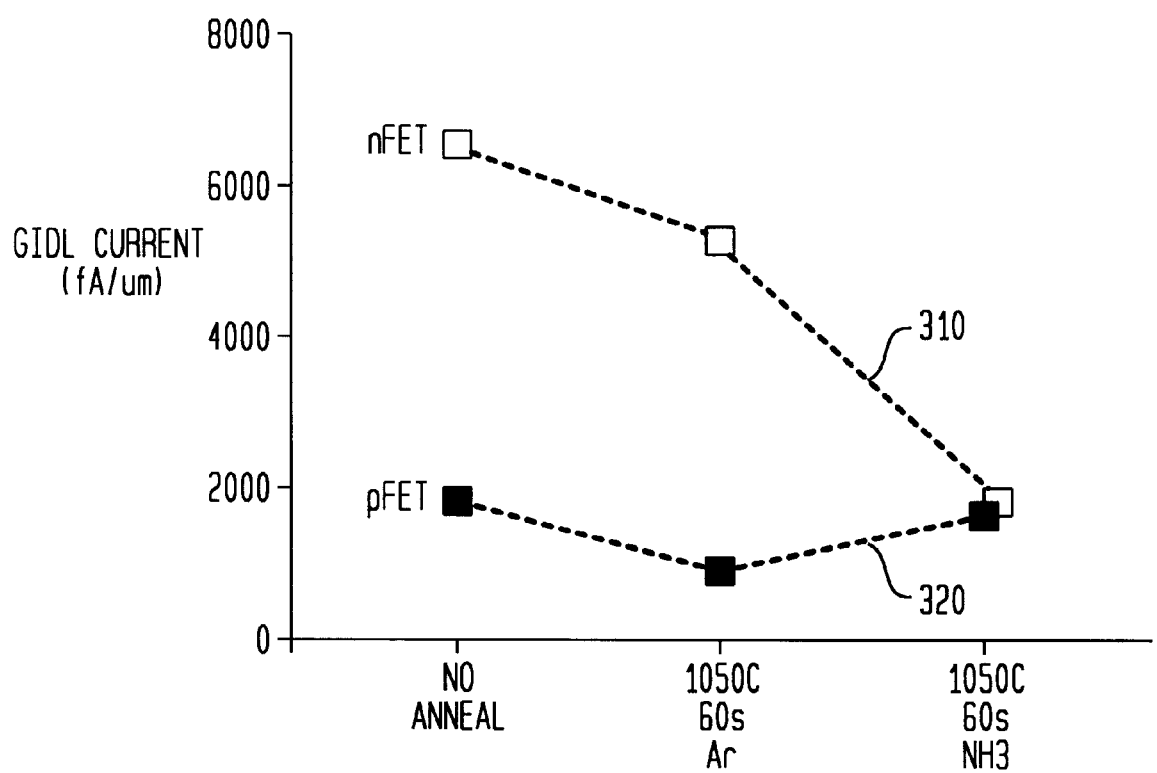
FIG. 3 show experimental results on affects of the invention on GIDL.

The results of the experiments were plotted in FIG. 3. Line 310 represents GIDL measurements of n-channel devices and line 320 represents GIDL measurements of p-channel devices. As shown, GIDL was reduced in both the p- and n-channel devices after being annealed. As indicated by line 320, annealing p-channel devices in Ar is more effective than annealing in $NH_3$. In contrast, annealing n-channel devices in $NH_3$ is more effective in reducing GIDL than Ar, although both ambients reduces GIDL as compared to not being annealed. As such, it is preferable to anneal p-channel devices in an Ar ambient and n-channel devices in $NH_3$ ambient. Although not shown, annealing the devices in a mixture of Ar and $NH_3$ is also effective for reducing GIDL in both n- and p-channel devices.

Referring to FIG. 2c, a resist layer is deposited over the substrate and patterned to serve as an ion implant mask. Dopants, such as As or P, are then implanted to form the drain 230 and source 240 regions. Thus a device with reduced GIDL is formed.

Additional processing is performed. Such processing includes, for example, the formation of a nitride liner 270 over the device to serve as an etch stop for borderless contact formation. Subsequently, an interlevel dielectric material (not shown) such as doped or undoped silicate glass is formed over the nitride liner. Contact opening are formed as desired to provide appropriate connections to, for example, $V_D$ and ground.

While the invention has been particularly shown and described with reference to various embodiments, it will be recognized by those skilled in the art that modifications and changes may be made to the present invention without departing from the scope thereof. The scope of the invention should therefore be determined not with reference to the above description but with reference to the appended claims along with their full scope of equivalents.

What is claimed is:

1. A method for forming a metal oxide semiconductor (MOS) transistor, comprising:

providing a substrate;

performing a gate threshold voltage implant in a portion of said substrate to achieve a desired gate threshold voltage in a channel region;

forming a gate stack;

forming drain and source regions of said transistor; and reducing gate-induced drain leakage of said transistor by at least 50 percent comprising annealing said substrate in a substantially NH3 non-oxidizing ambient environment using a rapid thermal anneal (RTA) process.

2. The method recited in claim 1 wherein said rapid thermal anneal (RTA) process takes place at a temperature range of 800–1200° C.

3. The method recited in claim 2 comprising forming the transistor as an NFET device.

4. A method for forming a metal oxide semiconductor (MOS) transistor, said method comprising:

forming a p-type conductivity channel region in a substrate;

forming a gate stack above said channel region;

forming dielectric sidewalls on the gate stack;

forming drain and source regions of said transistor; and reducing gate-induced leakage of said transistor by at least 50 percent comprising annealing said transistor in a substantially NH3 non-oxidizing ambient atmosphere using a rapid thermal anneal process.

5. The method recited in claim 4 wherein the gate-induced leakage reducing step is prior to the sidewall forming step.

6. The method recited in claim 4 wherein the gate-induced leakage reducing step is subsequent to the sidewall forming step.

7. The method recited in claim 5 wherein the sidewall forming step comprises oxidizing sidewall of the gate stack.

8. The method recited in claim 6 wherein the sidewall forming step comprises oxidizing sidewall of the gate stack.

* * * * *